United States Patent
Chang et al.

(10) Patent No.: US 10,312,088 B1
(45) Date of Patent: Jun. 4, 2019

(54) SELF-ALIGNED DOUBLE PATTERNING METHOD

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Feng-Yi Chang, Tainan (TW); Fu-Che Lee, Taichung (TW); Ying-Chih Lin, Tainan (TW); Gang-Yi Lin, Taitung County (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/900,764

(22) Filed: Feb. 20, 2018

(30) Foreign Application Priority Data

Jan. 9, 2018 (CN) .......................... 2018 1 0018346

(51) Int. Cl.
*H01L 21/033* (2006.01)
*H01L 27/108* (2006.01)

(52) U.S. Cl.
CPC ...... *H01L 21/0338* (2013.01); *H01L 21/0332* (2013.01); *H01L 21/0335* (2013.01); *H01L 21/0337* (2013.01); *H01L 27/10855* (2013.01)

(58) Field of Classification Search
None
See application file for complete search history.

(56) References Cited

U.S. PATENT DOCUMENTS

| | | | |
|---|---|---|---|
| 9,029,263 B1 * | 5/2015 | Kim | H01L 21/823437 257/E21.038 |
| 9,633,907 B2 * | 4/2017 | Fu | H01L 23/5226 |
| 9,881,794 B1 * | 1/2018 | Su | H01L 21/0332 |
| 9,905,464 B2 * | 2/2018 | Hung | H01L 21/823431 |
| 9,922,834 B2 * | 3/2018 | Liou | H01L 21/308 |
| 10,103,019 B1 * | 10/2018 | Chang | H01L 21/02019 |
| 10,163,723 B2 * | 12/2018 | Fu | H01L 21/823487 |
| 2006/0263699 A1 | 11/2006 | Abatchev | |
| 2015/0348848 A1 * | 12/2015 | Fu | H01L 23/5226 257/329 |
| 2018/0151363 A1 * | 5/2018 | Su | H01L 21/0332 |

* cited by examiner

*Primary Examiner* — Allan W. Olsen
(74) *Attorney, Agent, or Firm* — Winston Hsu

(57) ABSTRACT

A self-aligned double patterning method includes the steps of forming line structures spaced apart from each other in a first direction on a mask layer, forming dielectric layer on the line structures, performing an etch back process so that the top surfaces of the line structures and the dielectric layer are flush, forming layer structure with same material as the line structures on the line structures and the dielectric layer, forming spacers spaced apart from each other in a second direction on the layer structure, and performing an etch process with the spacers as an etch mask to pattern the line structures and the dielectric layer.

10 Claims, 7 Drawing Sheets

SELF-ALIGNED DOUBLE PATTERNING METHOD

BACKGROUND OF THE INVENTION

1. Field of the Invention

The present invention relates generally to a self-aligned double patterning (SADP) method, and more particularly, to a SADP method applied to cross SADP process.

2. Description of the Prior Art

With semiconductor devices scaling down, the Critical Dimension (CD) of photolithography is beyond the limit of optical lithography, which brings great challenges to semiconductor manufacturing industry, especially to photolithography technology. Extreme ultraviolet (EUV) lithography has higher photolithographic resolution, but for some reason it does not appear to be ready in practice and mass production. Therefore, further research and development is required in the field of optical lithography in the coming several years. Other technology, for example, Resolution Enhancement Technology (RET), Phase-Shift Mask (PSM) technology, various illumination techniques and Optical Proximity Correction (OPC) technology, etc, may also further extend the application of dry lithography. In addition, by placing an immersion fluid with high refractive index between the exposure tool lens and the resist-coated wafer, Immersion lithography can achieve higher Numerical Aperture (NA) as well as higher resolution, thus has promoted the development of photolithography.

In the progress of photolithography, double patterning (DP) is a potential way to enhance the lithography resolution without the need to change the tool infrastructure. The basic idea of double patterning is to separate one photomask into two complementary ones, and to form one photo layer through two separate exposure steps using the two different photomasks. In this way, higher lithography resolution is achieved compared with traditional single exposure method, and the service life of the lithography tools is also greatly extended. There are several types of double patterning including Litho-Etch-Litho-Etch (LELE) double patterning, Litho-Freeze-Litho-Etch (LFLE) double patterning, Self-Aligned Double Patterning (SADP) and other improved solutions. For Self-Aligned-Double-Patterning technology, a spacer is formed by deposition or reaction of the film on the previous pattern, followed by etching to remove all the film material on the horizontal surfaces, leaving only the material on the sidewalls of preformed patterned feature. The original patterned feature is then removed and the pattern of spacer is transferred to the underlying material layer, thereby obtaining the pattern with smaller critical dimension. Since there are two spacers for every line, the line density would be doubled compared to the original photolithographic pattern.

The self-aligned double patterning method is usually used to form line patterns. However, in certain processes such as the process of manufacturing the contact pad for storage node in memory devices, the contact pad is more like a dot pattern rather than a line pattern. These dot patterns cannot be formed through only one-time self-aligned double patterning process. For this reason, the current approach is to adopt the cross SADP method, wherein two self-aligned double patterning processes will be conducted to define overlapped patterns and form the dot pattern.

The current cross SADP method still comes across some problems. First, the spacer served as the photomask should be removed by an etch process after the patterning steps. However, this etch process is apt to damage the underlying pattern defined in previous process. Furthermore, since two self-aligned double patterning processes will be conducted in cross SADP method, there will be a multilayer structure with different materials formed on the target layer to be patterned, such as the multilayer structure with alternate silicon oxide layers and silicon oxynitride layers. This kind of multilayer structure is difficult to be fully removed after the patterning and residue is apt to remain on the substrate and cause pattern defects. Therefore, a novel process is still required and should be developed to solve these problems in the semiconductor industry.

SUMMARY OF THE INVENTION

In order to solve the above-mentioned problems apt to occur in a cross self-aligned double patterning process, a novel process is provided in the present invention with the technical features of an additional etch back process and the step of forming additional layer structures to make the multilayer structure on the target layer to be a structure with single material, so there will be less residue left on the substrate to cause defects after the removing step.

The objective of present invention is to provide a self-aligned double patterning (SADP) method, including the steps of providing a substrate with a mask layer, forming a plurality of line structures on the mask layer, wherein the line structures extend in a first direction and spaced-apart from each other, forming a dielectric layer on the line structures and the substrate, performing an etch back process so that the top surfaces of line structures and dielectric layer are flush, forming a layer structure on the line structures and the dielectric layer, wherein the material of layer structure and line structures are the same, forming a plurality of spacers in a second SADP process on the layer structure, wherein the spacers in the second SADP process extend in a second direction and spaced-apart from each other, and performing a first etch process with the spacers in the second SADP process as an etch mask to pattern the layer structure, the line structures and the dielectric layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings:

FIGS. 1-6a, FIG. 7 and FIG. 8 are cross-sectional views illustrating a process flow of the self-aligned double patterning (SADP) method at different steps in accordance with one embodiment of the present invention;

FIG. 6b, FIG. 6c and FIG. 6d are schematic cross-sectional views illustrating respectively the cross-sections with orientations different from the one shown in FIG. 6a.

Figure 1:
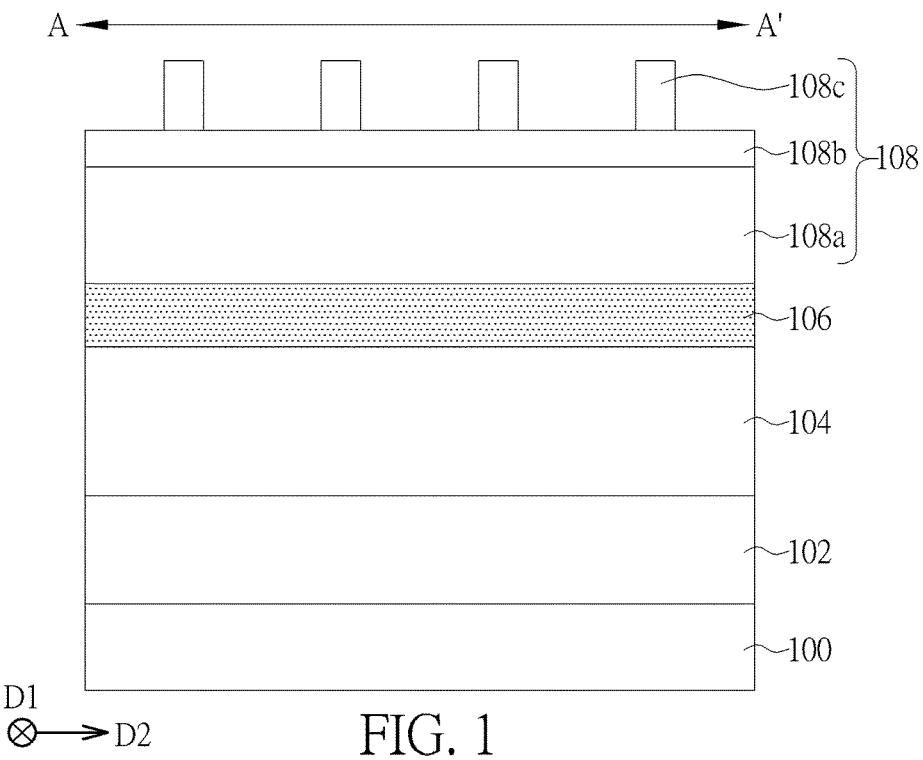

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

Before describing the preferred embodiment in more detail, further explanation shall be given regarding certain terms that may be used throughout the descriptions. For example, the term "etch" or "etching" is used herein to generally describe a fabrication process of patterning a material, such that at least a portion of the material remains after the etch is completed. For example, it should be understood that the process of etching silicon involves the steps of patterning a masking layer (e.g., photoresist or a hard mask) above the silicon, and then removing the areas of silicon no longer protected by the masking layer. As such, the areas of silicon protected by the mask would remain behind after the etch process is complete. However, in another example, etching may also refer to a process that does not use a mask, but still leaves behind at least a portion of the material after the etch process is complete.

The above description serves to distinguish the term "etching" from "removing." When etching a material, at least a portion of the material remains behind after the process is completed. In contrast, when removing a material, substantially all of the material is removed in the process. However, in some embodiments, "removing" is considered to be a broad term that may incorporate etching.

The "substrate" as used throughout the descriptions is most commonly thought to be silicon. However, the substrate may also be any of a wide array of semiconductor materials such as germanium, gallium arsenide, indium phosphide and etc. In other embodiments, the substrate may be electrically non-conductive such as a glass or sapphire wafer.

In the drawings of present invention, FIGS. 1-6a, FIG. 7 and FIG. 8 are schematic cross-sectional views sequentially illustrating the process flow of self-aligned double patterning (SADP) method at different steps in accordance with the embodiment of present invention. The connections between components and layer structures and their layout in the view of semiconductor plane are clearly shown in the figures.

Please refer first to FIG. 1 that is a schematic cross-sectional view of layer structures in the beginning of the self-aligned double patterning method of present invention. A substrate (ex. a silicon substrate) is first prepared before the process. In the preferred embodiment of present invention, the substrate 100 may be formed in advance with word lines, bit lines, source/drain, storage node contact plug, and material layers for storage node contact pad in memory process. In this regard, since the method and structure of present invention is not focused on the memory process before the formation of storage node contact pads, detailed description of relevant process will not be provided herein in case of obscuring the key features of present invention and complicating the drawings.

An etch target layer 102 (ex. a silicon oxide layer) is formed on the substrate 100. The etch target layer 102 is the final target layer to be patterned in the cross self-aligned double patterning method according to the embodiment of present invention. For example, the target layer may be patterned into the patterns for storage node contact pads or storage node contact plugs. An etch mask layer 104, such as an ADVANCE PATTERN FILM (APF™) provided by Applied Materials, Inc, is formed on the target layer 102 to provide excellent etch selectivity and line edge roughness (LER) lower than conventional photoresists, so as to achieve well-controlled critical dimension. The ADVANCE PATTERN FILM (APF™) is also provided with ashable property like conventional photoresist is also ashable likes conventional photoresists, so that it can be easily integrated into the current process.

A mask layer 106, such as a silicon oxynitride (SiON) layer, is further formed on the etch mask layer 104. In the embodiment of present invention, the mask layer 106 will be first patterned into desired pattern, such as the pattern of storage node contact pads, so that it can be used as an etch mask in later process to transfer the defined pattern to the underlying etch mask layer 104 and etch target layer 102 and to complete the final target patterns.

Refer still to FIG. 1. A multilayer mask structure 108 is then formed on the mask layer 106, including an organic dielectric layer (ODL) 108a, an anti-reflection dielectric layer 108b and a photoresist 108c from the bottom up. The thickness of organic dielectric layer 108a and anti-reflection dielectric layer 108b are about 100 nm and 20 nm respectively, wherein a plurality of line patterns are defined beforehand in the photoresist 108c by the photolithographic process. These defined line patterns are mandrel patterns to be used in following first self-aligned double patterning process. In the embodiment of present invention, preferably, the line pattern extends in a first direction D (the direction into or out of paper).

Figure 2:
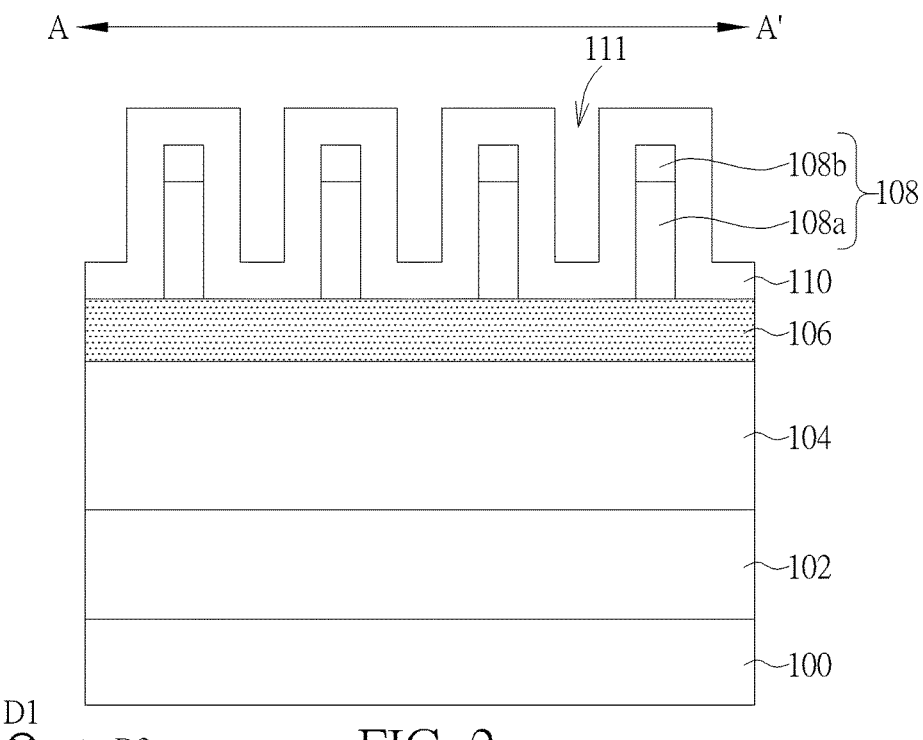
Figure 3:
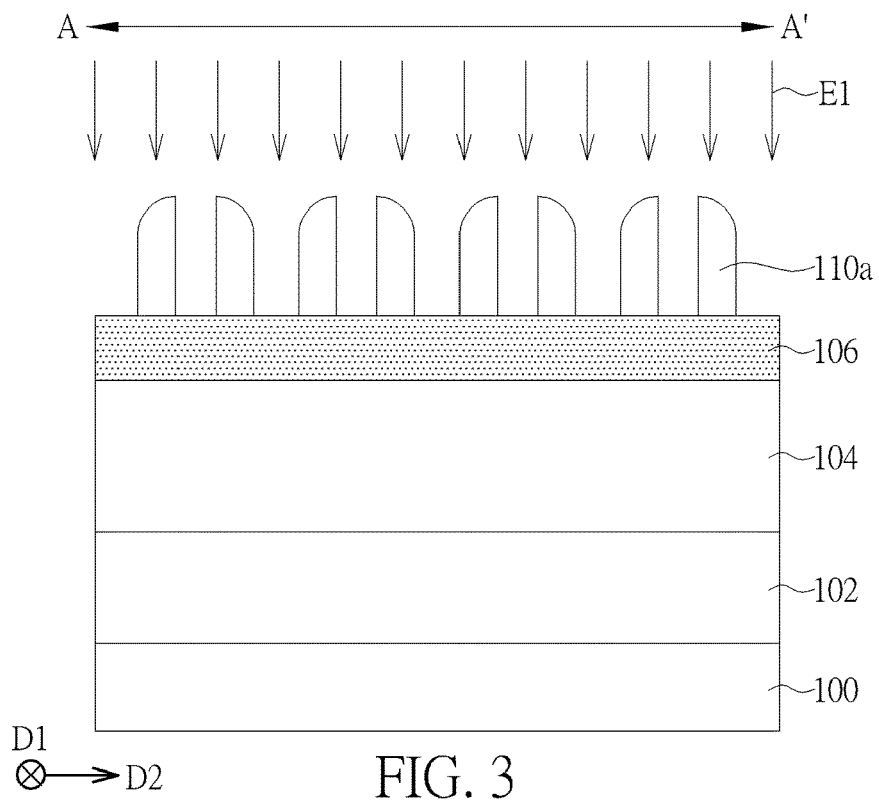

Please refer next to FIG. 2. After the above-described multilayer mask structure 108 is formed, the line patterns of photoresist 108c are transferred into the underlying anti-reflection dielectric layer 108b and organic dielectric layer 108a, and the photoresist 108c is then removed. In this way, the anti-reflection dielectric layer 108b and the organic dielectric layer 108a would collectively constitute the mandrel structure in the embodiment of present invention. As shown in FIG. 3, after the mandrels 108a/108b is formed, a conformal spacer layer (ex. a silicon oxide layer) 110 is formed on the entire surface. The thickness of the spacer layer 110 is about 250 Å-300 Å, which may be formed by atomic layer deposition (ALD) to achieve precise thickness control. The spacer layer 110 would cover uniformly on the surface of mask layer 106 and the mandrels 108a/108b. More specifically, the thickness of spacer layer 110 is adjusted to a value that trenches 111 will be formed therebetween with a width about 250 Å-300 Å similar to the width of mandrel. The spacer layer 110 will be transformed into the spacer used in SADP in later process.

After the conformal spacer layer 110 is formed, as it is shown in FIG. 3, an anisotropic etch process is then performed to remove the layer structure to a certain thickness on the surface, so that the spacer 110 is transformed into the first spacer 110a at two sides of each mandrel 108a/108b. The advantage of this manufacturing method is that the first spacer 110a is formed and self-aligned at both sides of each mandrel 108a/108b, namely self-aligned double patterning (SADP) method. Please note that in the embodiment, since the patterned mask layer 106 is preferably made of silicon oxynitride, which is different from the silicon oxide of spacer layer 110. The two materials have good ratio of etch selectivity, so that only the spacer layer 110 is etched in the etch process while the patterned mask layer 106 is intact. After the first spacer 110a is formed, a selective etch process is performed to remove the exposed mandrels 108a/108 between the first spacers 110a, thereby forming the spaced-apart first spacer 110a extending in a first direction D1 on the mask layer 106.

Figure 4:
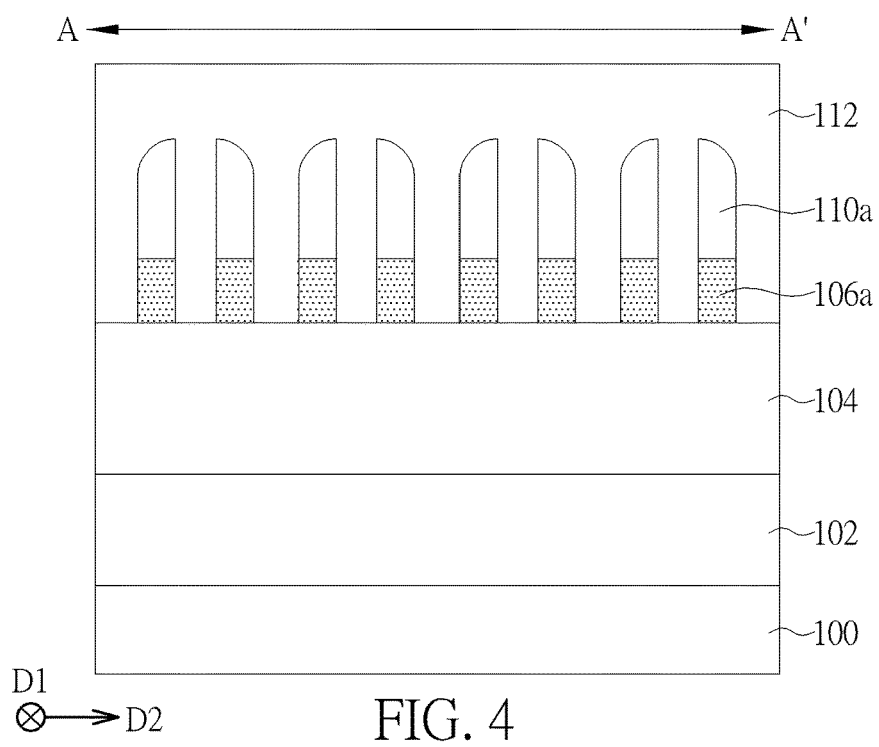

Please refer to FIG. 4. After the spaced-apart first spacer 110a is formed, an anisotropic etch process E1 is then performed with the first spacer 110a as an etch mask to etch the underlying mask layer 106, so that the pattern of first spacer 110a is transferred to the patterned mask layer 106 and forms multiple line patterns extending in the first direction D1. In the embodiment of present invention, through the method of patterning the mask layer 106 beforehand into the desired pattern (ex. the pattern of storage node contact pads), the patterned mask layer 106 may function as an etch mask in later process to further transfer the desired pattern into the underlying etch mask layer 104 and etch target layer 102, thereby completing the final desired target pattern. Please note that in the embodiment, since the patterned mask layer 106 is preferably made of silicon oxynitride, which is different from the underlying, ADVANCE PATTERN FILM (APF™)-based etch mask layer 104, the two materials would have good ratio of etch selectivity, so that only the mask layer 106 is etched while the etch mask layer 104 is intact in the etch process.

Please also note that, in conventional process, a wet etch process or soft etch process will be performed first after the formation of patterned mask layer 106a to remove the unnecessary first spacer 110a thereon. However, this removing process is apt to peel the underlying patterned mask layer 106a from the surface of etch mask layer 104 or damage the defined pattern. As the result, the pattern formed in following self-aligned double patterning process will be distorted. To solve this problem, as shown in FIG. 4 in the embodiment of present invention, the overlying first spacer 110a is not removed for the moment after the patterned mask layer 106a is patterned. Instead, a silicon oxide based organic dielectric layer (ODL) 112 would be formed first on both layers. The function of organic dielectric layer 112 is to fill up the trench between the first spacers 110a and provide a flat surface thereon for the following etch back process.

Figure 5:
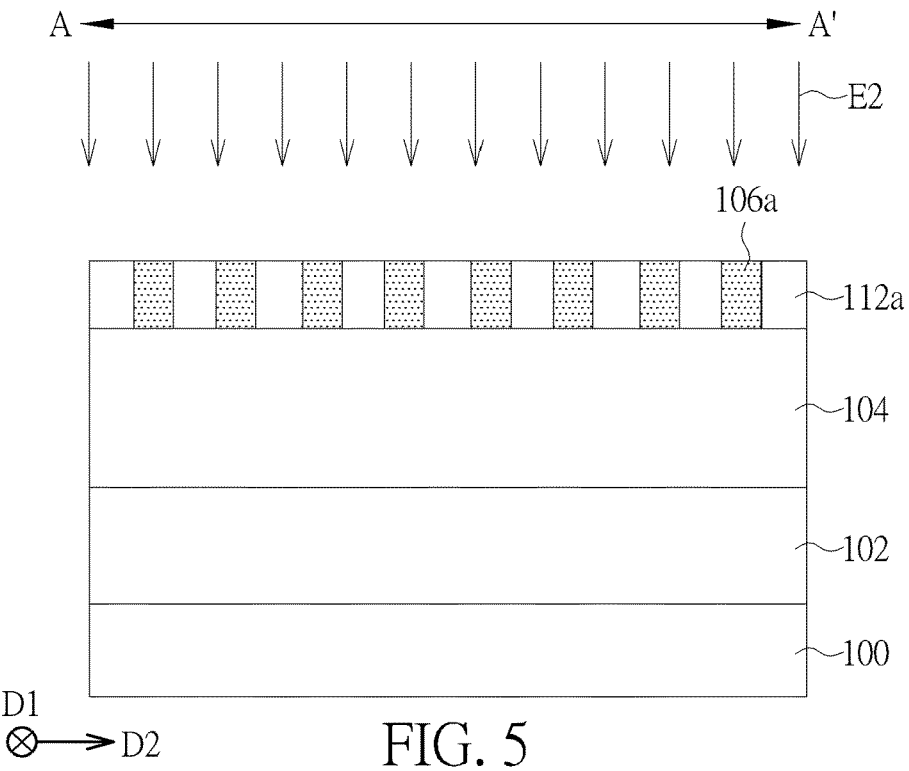

Please refer to FIG. 5. After the first spacers 110a are covered with the organic dielectric layer 112, an etch back process E2 is then performed to remove all the first spacers 110a and a part of the organic dielectric layer 112 until the patterned mask layer 106a is exposed, so that the top surface of patterned mask layer 106a is flush with the top surface of adjacent remaining organic dielectric layer 112. Please note that in the embodiment of present invention, since the first spacer 110a and the organic dielectric layer 112 are both preferably made of silicon oxide based materials while the patterned mask layer 106a is preferably made of silicon oxynitride, the two materials would have good ratio of etch selectivity, so that the first spacer 110a and the organic dielectric layer 112 with a certain thickness may be concurrently and uniformly removed in the etch back process E2 until the patterned mask layer 106a is exposed, and this exposed patterned mask layer 106a is intact in the etch back process E2. In this way, most organic dielectric layer 112 would be removed and only the portion between the patterned mask layers 106a will remain. Through this approach of forming the organic dielectric layer 112 and performing the etch back process E2, the first spacer 110a may be completely removed from the patterned mask layer 106a without damaging or peeling the patterned mask layer 106a from the substrate. In other embodiment, the etch back process may be replaced with a chemical mechanical polishing (CMP) process. In the embodiment of present invention, the remaining organic dielectric layer 112a may finally serve as a patterned mask defined in this cross SADP process, wherein relevant details and drawing will be explained for further understanding in the following embodiment.

Figure 6A:
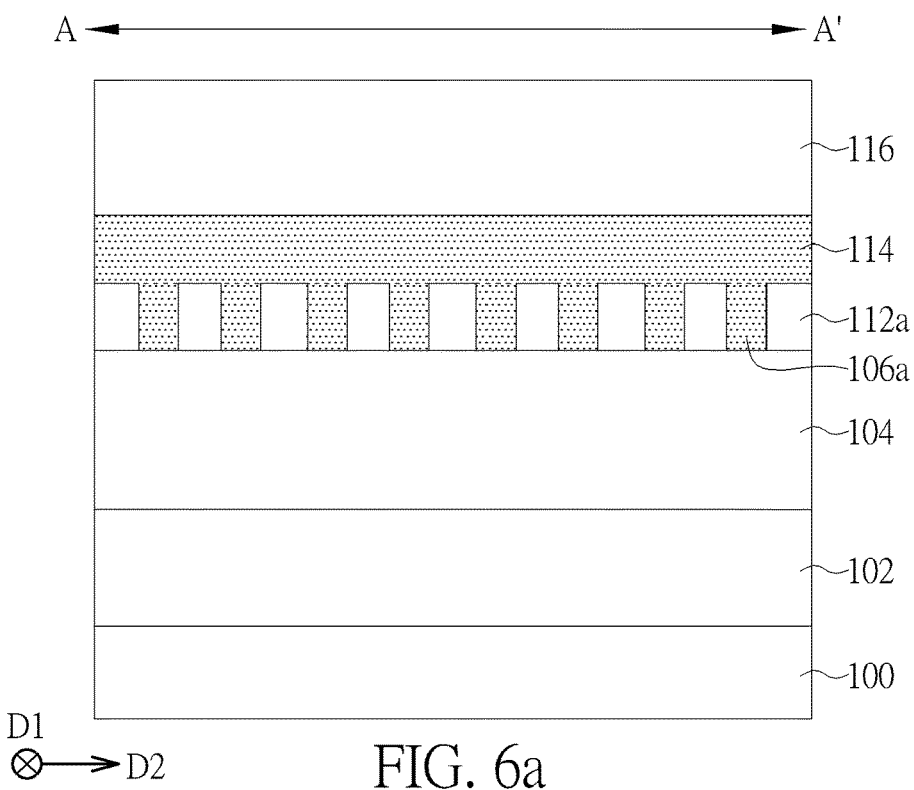

Please refer to FIG. 6a. After the first spacer 110a is removed in the etch back process E2, a layer structure 114 is then formed on the surface of substrate to cover the organic dielectric layer 112a and the patterned mask layer 106a. Please note that in the embodiment of present invention, the layer structure 114 and the underlying patterned mask layer 106a would have same material, such as silicon oxynitride (SiN), so that the layer structure 114 and the underlying patterned mask layer 106a may be generally considered as single structure.

Please note that, as it is described in previous paragraphs, the organic dielectric layer (ODL) 112 covering on the patterned mask layer 106a in prior art will not be removed by performing this additional etch back process E2 to expose the patterned mask layer 106a, thus the layer structure 114 formed in later process will not contact the patterned mask layer 106a with same material. There will be an organic dielectric layer 112 therebetween. For this reason, the etch process of second self-aligned double patterning process in the cross SADP method of prior art should etch through the multilayer structure with alternate ODL-SiN-ODL-SiN multilayer, so that the patterned mask will be easily consumed in the etch process of second SADP stage, and there will be residue of the patterned mask remain on the process surface after the removal.

For this reason, in the embodiment of present invention, the approaches of the etch back step for the organic dielectric layer 112 and forming the layer structure 114 directly on the exposed patterned mask layer 106a with same material may effectively solve the problem of excessive alternate multilayer structure in prior art and facilitate the performing of following second SADP process.

Figure 9:
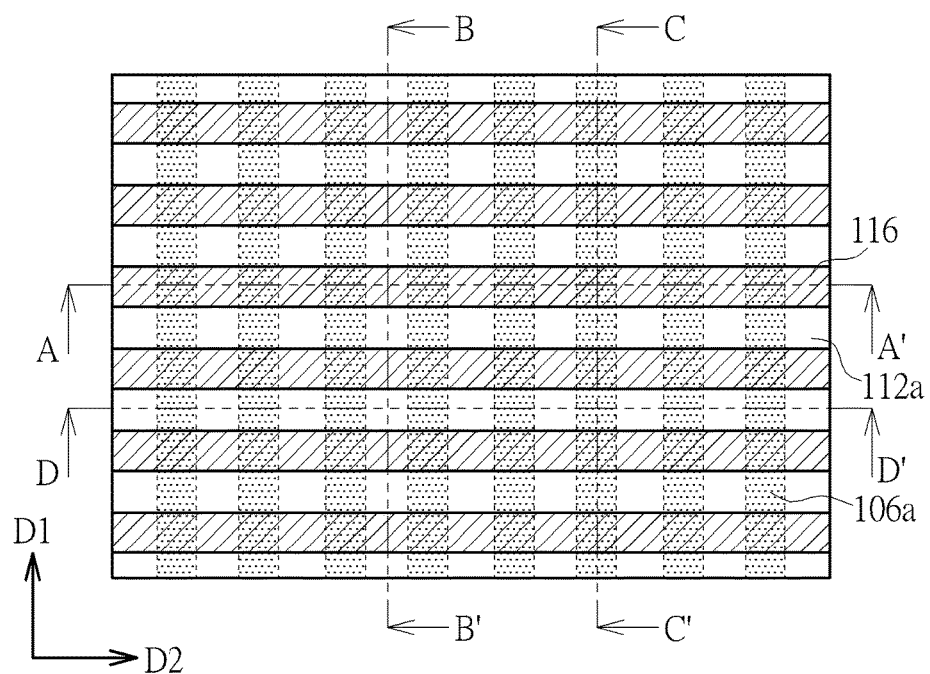
FIG. 9 and FIG. 10 are schematic top views of the mask pattern before and after the cross self-aligned double patterning method in accordance with one preferred embodiment of present invention.

Refer still to FIG. 6a. After the layer structure 114 is formed, the structure of second spacer 116 to be used in second SADP process will then be formed on the layer structure 114. Since the desired pattern is cross self-aligned double pattern, the second spacers 116 shown in FIG. 6a would extend in a second direction D2 rather than in the first direction D1 like the first spacers 110a shown in FIG. 3. The second direction D2 is preferably perpendicular to the first direction D1. FIG. 9 is a schematic top view illustrating the multilayer structure of present invention at this stage. FIG. 6a is the schematic cross-sectional view taken along the section line A-A' in FIG. 9. It can be seen in FIG. 9 that the section line A-A' traverses the second spacers 116 extending in the second direction D2. There will be spaced-apart patterned mask layer 106a and organic dielectric layer 112 under the second spacers 116. Please note that the forming step of the above-identified second spacer 116 is identical to the steps of embodiment shown in FIGS. 1-3. For the clarity of the disclosure, no more details will be addressed herein.

Figure 6B:
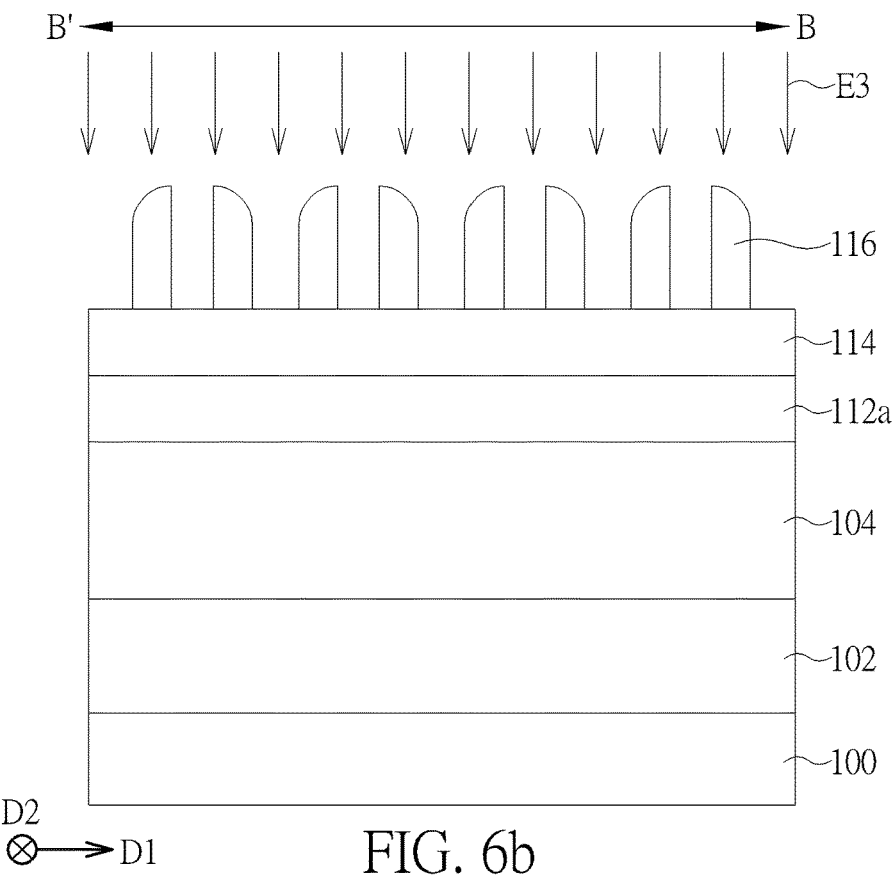
Figure 6C:
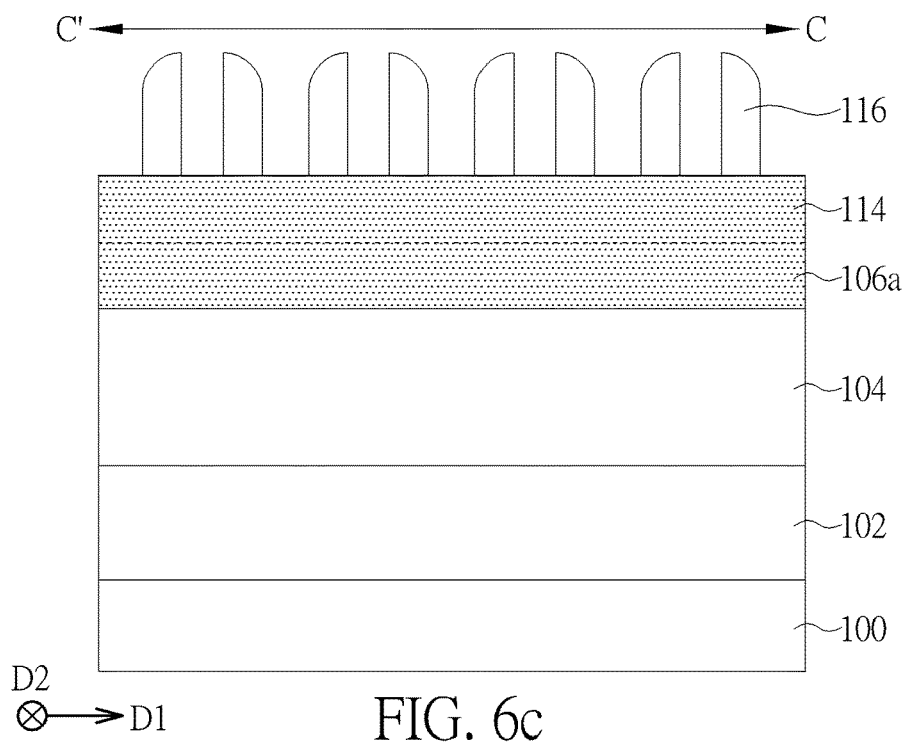
Figure 6D:
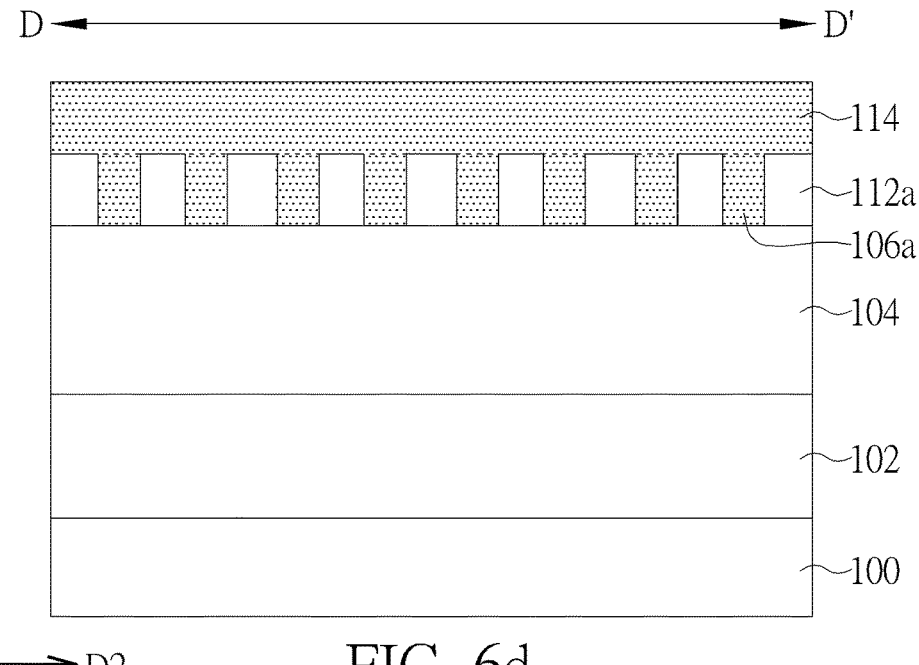

To provide the reader with a better understanding for the multilayer structure of present invention in different aspects, FIG. 6b, FIG. 6c and FIG. 6d are schematic cross-sectional views taken along the section lines B-B', C-C' and D-D' in FIG. 9, respectively. It can be seen in FIG. 6b that the section line B-B' traverses multiple second spacers 116 extending in the second direction D2 and the underlying organic dielectric layer 112a in same first direction D1, wherein the layer structure 114 between the second spacers 116 and the organic dielectric layer 112a is omitted in the top view of FIG. 9 in order to provide clear underlying structure. It can be seen in FIG. 6c that the section line C-C' also traverses multiple second spacers 116 along the first direction D1 and the underlying patterned mask layer 106a in same first direction D1. FIG. 6d is taken along the section line D-D' traversing the trench regions between the second spacers 116 along the second direction D2, wherein the spaced-apart line patterns of patterned mask layer 106a and the organic dielectric layer 112a extending in the first direction D1 formed beforehand in the first SADP process are provided thereunder.

Refer back to FIG. 6b. Please note that since the following process to be conducted is the second patterning process in cross SADP method, the cross-sectional view of FIG. 6b will be presented in an orientation perpendicular to the orientation of original cross-sectional views shown in the process flow of FIG. 1 to FIG. 6a, which is explained herein in advance to avoid the confusion. As shown in FIG. 6b, after the spaced-apart second spacers 116 are formed, an anisotropic etch process E3 is performed to the underlying layer structure 114 and organic dielectric layer 112a with the second spacers 116 as an etch mask, thereby transferring the pattern of second spacers 116 to the organic dielectric layer 112b. After the second patterning process, the unnecessary second spacers 116 and the layer structure 114 on the organic dielectric layer 112b are removed by an additional etch process, such as a wet etch process or soft etch process. Alternatively, the second spacers 116 and the layer structure 114 may be removed by the removing method shown in the embodiment of FIG. 4 and FIG. 5 in case of the second spacer 116 would remain or be peeled from the surface of organic dielectric layer 112b.

Figure 7:
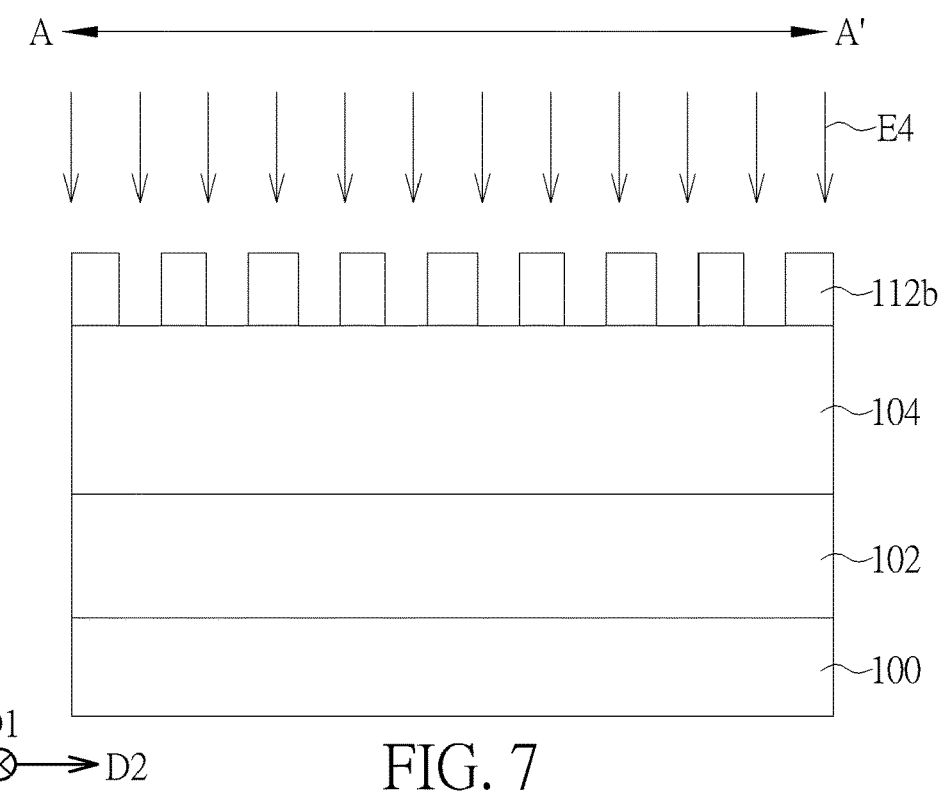
Figure 10:
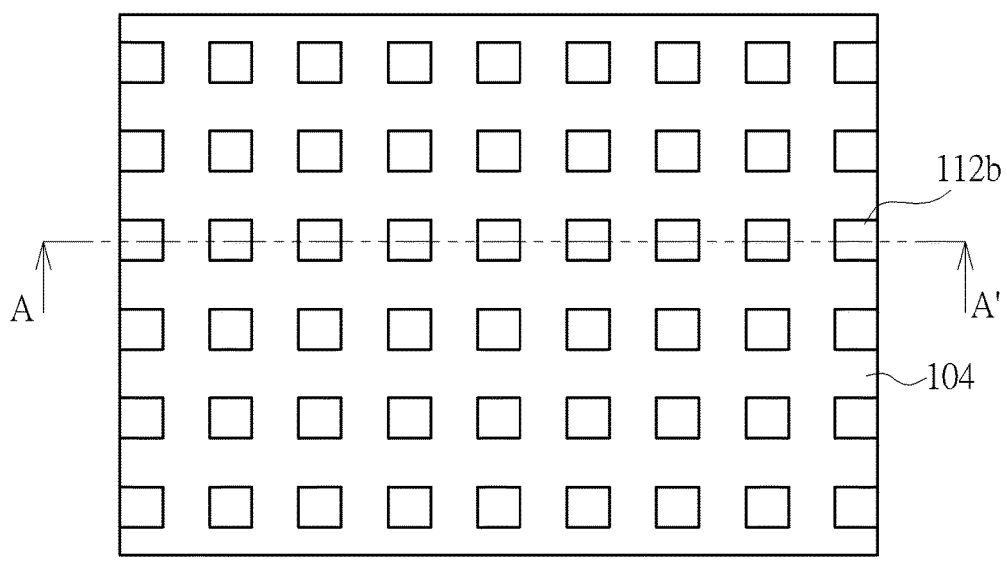

Please note that since the organic dielectric layer 112a is already formed with the spaced-apart line structures extending in the first direction D1 in previous first patterning process, the original line structures will be cut into dot pattern as shown in FIG. 10 after the pattern from the second spacers 116 is transferred to the above-described line structures. This dot pattern is exactly the desired pattern that the cross SADP process dedicates to define in the embodiment of present invention. FIG. 7 is the cross-sectional view of the dot pattern taken along the section line A-A', wherein the dot-type organic dielectric layer 112b is formed and distributed uniformly on the ADVANCE PATTERN FILM (APF™)-based etch mask layer 104. Another distinguishing feature different from prior art in the embodiment of present invention is that the silicon oxynitride based mask layer in prior art is usually reserved after two patterning processes to serve as the dot mask in later process, while the dot-type organic dielectric layer 112b in the present invention is the one reserved as the final defined etch mask. In the present invention, the patterned mask layer 106a is exposed by the previous etch back process shown in FIG. 5 and FIG. 6a and then have a layer structure 114 with same material formed directly thereon, so that the silicon oxynitride based patterned mask layer 106a and the layer structure 114 would become single structure and will be removed collectively in the second patterning process. As a result, the remaining organic dielectric layer 112b in dot distribution would be the final defined etch mask.

Figure 8:
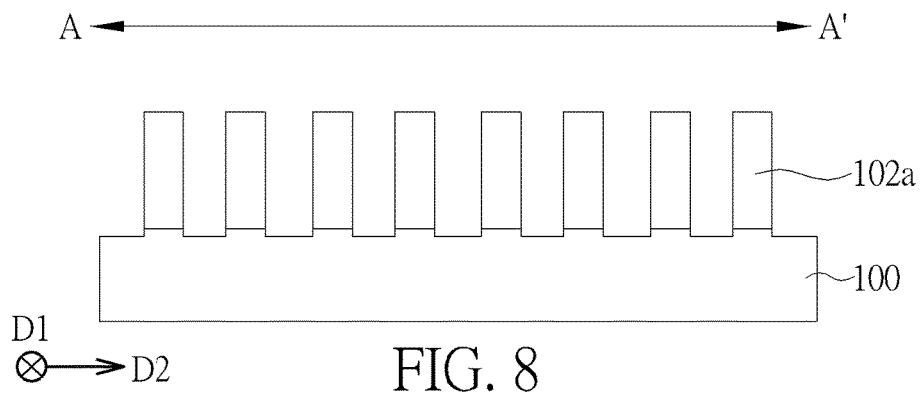

Final, please refer to FIG. 7. After the dot-distributed organic dielectric layer 112b is formed, an anisotropic etch process E4 is performed to the underlying etch mask layer 104 and the etch target layer 102 using the organic dielectric layer 112b as an etch mask, thereby transferring the dot pattern of organic dielectric layer 112b to the etch target layer 102 and forming the patterned etch target layer 102a. The organic dielectric layer 112b and the etch mask layer 104 on the etch target layer 102a are then removed to obtain the etch target layer 102a as shown in FIG. 8 with dot-distributed pattern on the substrate 100. In current memory process, this dot pattern may serve as the pad pattern or contact plug pattern for storage nodes of memory.

After the manufacture of etch target layer 102a with dot pattern is completed, the following process may include conventional memory processes. Since these process are complicated and not the key features of present invention, the detail and description about the following processes will not be provided herein in case of obscuring the focus of present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A self-aligned double patterning (SADP) method, comprising:
   providing a substrate with a mask layer formed thereon;
   forming a plurality of line structures on said mask layer, wherein said line structures extend in a first direction and spaced-apart from each other;
   forming a dielectric layer on said line structures and said substrate;
   performing an etch back process so that the top surfaces of said line structures and said dielectric layer are flush;
   forming a layer structure on said line structures and said dielectric layer, wherein the material of said layer structure and said line structures are the same;
   forming a plurality of spacers in a second SADP process on said layer structure, wherein the step of forming said spacers in said second SADP process comprises:
      forming a plurality of mandrels on said layer structure, wherein said mandrels extend in said second direction and spaced-apart from each other;
      forming a conformal spacer layer on said mandrels and said layer structure; and
      performing an anisotropic etch process to said spacer layer to form said spacers in said second SADP process, wherein said spacers in said second SADP process extend in a second direction and spaced-apart from each other; and
   performing a first etch process with said spacers in said second SADP process as an etch mask to pattern said layer structure, said line structures and said dielectric layer.

2. The self-aligned double patterning method of claim 1, wherein the step of forming said line structures comprises:

forming a plurality of mandrels and spacers in a first SADP process at two sides of each said mandrel on a material layer, wherein said spacers in said first SADP process extend in said first direction and spaced-apart from each other; and performing a second etch process with said spacers in said first SADP process as an etch mask to pattern underlying said material layer into said line structures.

3. The self-aligned double patterning method of claim 2, wherein said etch back process removes all said spacers in said first SADP process and parts of said dielectric layer on said line structures, so that said line structures are exposed and the top surfaces of said line structures and said dielectric layer are flush.

4. The self-aligned double patterning method of claim 2, wherein the material of said spacers in said first SADP process and said spacers in said second SADP process is silicon oxide.

5. The self-aligned double patterning method of claim 1, further comprising removing remaining said spacers in said second SADP process, said layer structure and said line structures after said first etch process.

6. The self-aligned double patterning method of claim 5, further comprising performing a third etch process with remaining said dielectric layer as an etch mask to pattern underlying said mask layer and a target layer after remaining said spacers in said second SADP process, said layer structure and said line structures are removed.

7. The self-aligned double patterning method of claim 6, further comprising removing said dielectric layer and said mask layer after patterning said target layer.

8. The self-aligned double patterning method of claim 1, wherein said first direction is perpendicular to said second direction.

9. The self-aligned double patterning method of claim 1, wherein the material of said layer structure and said line structures is silicon oxynitride.

10. The self-aligned double patterning method of claim 1, wherein said dielectric layer is an organic dielectric layer.

* * * * *